(12) United States Patent
Bates

(10) Patent No.: US 7,410,730 B2
(45) Date of Patent: Aug. 12, 2008

(54) THIN FILM BATTERY AND ELECTROLYTE THEREFOR

(75) Inventor: John B. Bates, Oak Ridge, TN (US)

(73) Assignee: Oak Ridge Micro-Energy, Inc., Oak Ridge, TN (US)

( * ) Notice: Subject to any disclaimer, the term of this patent is extended or adjusted under 35 U.S.C. 154(b) by 841 days.

(21) Appl. No.: 10/951,840

(22) Filed: Sep. 28, 2004

(65) Prior Publication Data

US 2008/0032200 A1    Feb. 7, 2008

Related U.S. Application Data

(63) Continuation-in-part of application No. 10/191,859, filed on Jul. 9, 2002, now Pat. No. 6,818,356.

(51) Int. Cl.
*H01M 6/18* (2006.01)
*C23C 14/34* (2006.01)

(52) U.S. Cl. .................... 429/322; 204/192.15
(58) Field of Classification Search ............... 429/322; 204/192.15
See application file for complete search history.

(56) References Cited

U.S. PATENT DOCUMENTS

| | | | |
|---|---|---|---|
| 5,338,625 A | 8/1994 | Bates et al. | |
| 5,512,147 A | 4/1996 | Bates et al. | |
| 5,561,004 A | 10/1996 | Bates et al. | |
| 5,569,520 A | 10/1996 | Bates | |
| 5,597,660 A | 1/1997 | Bates et al. | |
| 6,168,884 B1 | 1/2001 | Neudecker et al. | |
| 6,242,132 B1 | 6/2001 | Neudecker et al. | |
| 6,365,300 B1 | 4/2002 | Ota et al. | |

FOREIGN PATENT DOCUMENTS

| EP | 1052718 A11 | 11/2000 |
|---|---|---|
| JP | 2000340257 | 12/2000 |
| JP | 2001319520 | 11/2001 |

OTHER PUBLICATIONS

V.K. Deshpande, A. Pradel, and M. Ribes, "The Mixed Glass Former Effect in the Li2S:SiS2:GeS2 System", Mat. Res. Bull. vol. 23, No. 3, pp. 379-384 (1988).

(Continued)

*Primary Examiner*—Gregg Cantelmo
(74) *Attorney, Agent, or Firm*—Luedeka, Neely & Graham, PC

(57) ABSTRACT

A solid amorphous electrolyte composition for a thin-film battery. The electrolyte composition includes a lithium phosphorus oxynitride material containing an aluminum ion dopant wherein the atomic ratio of aluminum ion to phosphorus ion (Al/P) in the electrolyte ranges greater than zero up to about 0.5. The composition is represented by the formula:

$Li_tP_xAl_yO_uN_vS_w$, where $5x+3y=5$, $2u+3v+2w=5+t$, t ranges from about 2.9 to about 3.3, x ranges from about 0.94 to about 0.85, y ranges from about 0.094 to about 0.26, u ranges from about 3.2 to about 3.8, v ranges from about 0.13 to about 0.46, and w ranges from zero to about 0.2. Thin film batteries containing such electrolyte films have less tendency to fail prematurely.

24 Claims, 4 Drawing Sheets

OTHER PUBLICATIONS

R. Creus, J. Sarradin, R. Astier, A. Pradel, and M. Ribes, "The Use of Ionic And Mixed Conductive Glasses in Microbatteries", Mater. Sci. and Eng. B3, pp. 109-112 (1989).

J.B. Bates, N.J. Dudney, G.R. Gruzalski, R.A. Zuhr, A. Choudhry, C.F. Luck, "Electrical Properties of Amorphous Lithium Electrolyte Thin Films," Solid State Ionics 53-56, pp. 647-654 (1992).

J.B. Bates, G.R. Gruzalski, N.J. Dudney, and C.F. Luck, "New Amorphous Thin-Film Lithium Electrolyte and Rechargeable Microbattery," p. 337 in Proceedings of 35th International Power Sources Symposium, Institute of Electrical and Electronics Engineers, Piscataway, New Jersey, 1993.

K. Takada, N. Aotani, and S. Kondo, "Electrochemical Behaviors of Li+ Ion Conductor, Li3P04-Li2S-SiS2", J. Power Sources 43-44, pp. 135-141 (1993).

S.D. Jones and J.R. Akridge, "A Thin-Film Solid-State Microbattery", J. Power Sources 43-44, pp. 505-513 (1993).

K. Iwamoto, N. Aotani, K. Takada, and S. Kondo, "Rechargeable Solid State Batter with Lithium Conductive Glass, Li3PO4-Li2S-SiS2", Solid State Ionics 70/71, pp. 658-661 (1994).

J.B. Bates, G. R.Gruzalski, N.J. Dudney, C.F. Luck, and X. Yu, "Rechargeable Thin-Film Lithium Batteries," Solid State Ionics 70/71, pp. 619-628 (1994).

X. Yu, J.B. Bates, G.E. Jellison, Jr., and F.X. Hart, "A Stable Thin-Film Lithium Electrolyte: Lithium Phosphorous Oxynitride," J. Electrochem. Soc. vol. 144, No. 2, pp. 524-532 (1997).

J.B. Bates, N.J. Dudney, B.J. Neudecker, F.X. Hart, H.P. Jun, and S.A. Hackney, "Preferred Orientation of Polycrystalline LiCoO2 Films," J. Electrochem. Soc., 147 (1), pp. 59-70 (2000).

J.B. Bates, N.J. Dudney, B. Neudecker, A. Ueda, and C.D. Evans, "Thin-Film Lithium and Lithium-Ion Batteries," Solid State Ionics 135, pp. 33-45 (2000).

"Thin Film Battery Design", Oak Ridge National Laboratory, web page, copyright 2001.

J.B. Bates, N.J. Dudney, G.R. Gruzalski, R.A. Zuhr, A. Choudhry, C.F. Luck, and J.D. Robertson, "Fabrication and characterization of Amorphous Lithium Electrolyte Thin Films and Rechargeable Thin Film Batteries" J. Power Sources pp. 43-44, 103 (1993).

M. Tomozawa, "Phase Separation in Glass", in Treatise on Materials Science and Technology, vol. 17, p. 71, M. Tomozawa and R. H. Doremus, eds. (Academic Press, New York, 1979).

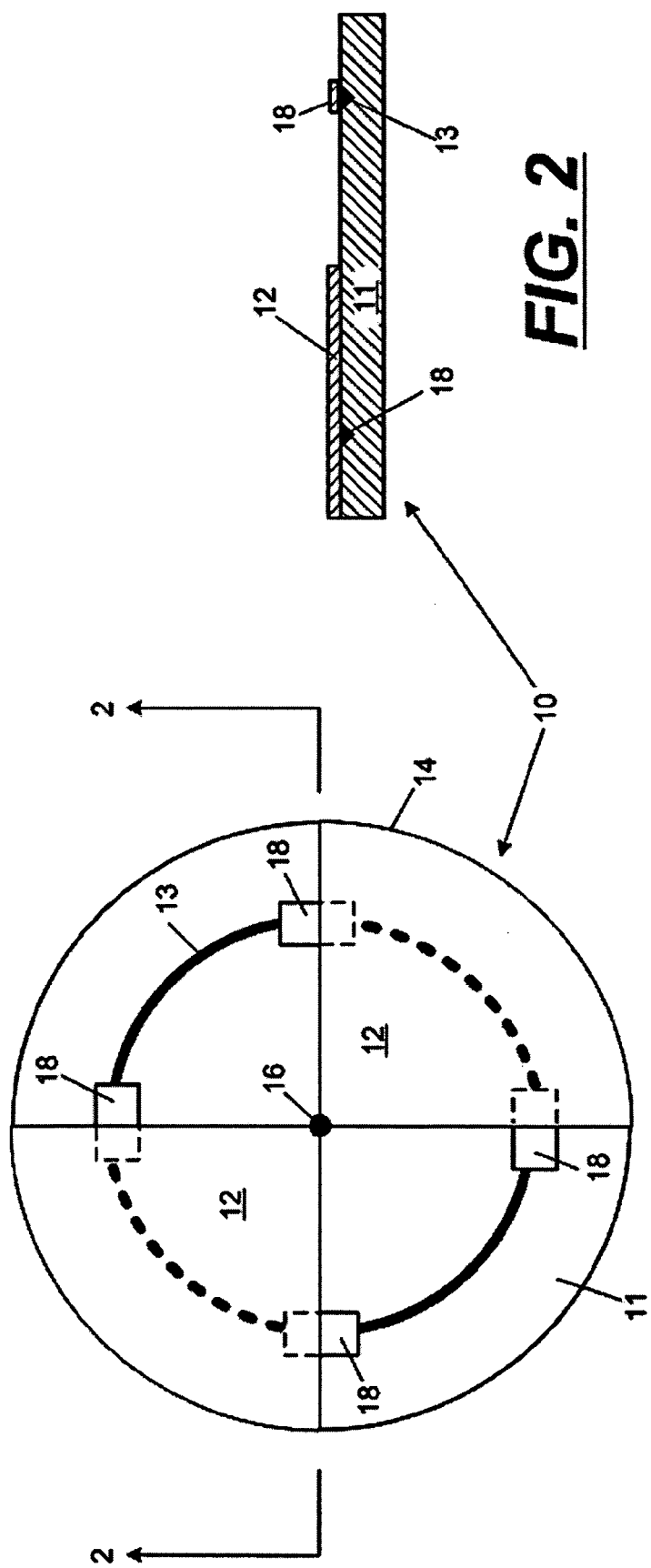

THIN FILM BATTERY AND ELECTROLYTE THEREFOR

This application is a continuation-in-part of application Ser. No. 10/191,859, filed Jul. 9, 2002, now U.S. Pat. No. 6,818,356 B1 entitled "THIN FILM BATTERY AND ELECTROLYTE THEREFOR", and is related to U.S. Pat. No. 6,994,933 B1 entitled "LONG LIFE THIN FILM BATTERY AND METHOD THEREFOR".

FIELD OF THE DISCLOSURE

The disclosure relates to thin film batteries and in particular to improved electrolytes for thin film batteries and methods of making improved electrolytes.

BACKGROUND

Thin-film rechargeable batteries have numerous applications in the field of microelectronics. For example, thin-film batteries provide active or standby power for microelectronic devices and circuits. Active power sources of the thin-film battery type are used, for example, in implantable medical devices, remote sensors, miniature transmitters, smart cards, and MEMS devices. Standby power sources of the thin-film battery type are used, for example, in PCMCIA cards and other types of CMOS-SRAM memory devices.

In a thin-film battery, a chemical reaction takes place between an anode and cathode by interaction of the anode and cathode through an electrolyte. The attractiveness of thin-film batteries over conventional batteries is that the electrolyte is a substantially solid or non-flowable material rather than a liquid. Liquid electrolytes pose leakage problems and are often highly corrosive. Of the solid electrolytes, thin-film batteries typically employ organic and ceramic electrolytes. Solid electrolytes are desirable in cells or batteries where liquid electrolytes may be undesirable, such as in implantable medical devices. Preferred solid electrolytes include materials that are solid at room temperature, electrically insulative and ionically conductive.

Examples of solid electrolytes include metallic salts and vitreous solid compositions. Metallic salt solid electrolytes include, for example, compounds that conform to the formula: AgI-MCN—AgCN, wherein M is potassium, rubidium, cesium or mixtures thereof. Vitreous solid compositions, or glasses, are generally comprised of a network former, a network modifier and, in those cases where the network modifier does not provide a mobile cation, a network dopant. A network former provides a macromolecular network of irregular structure. A network modifier is an ionic compound that becomes incorporated into the macromolecular network of the network former. A network dopant provides mobile cations to the network.

As advances are made in microelectronic devices, new uses for thin-film batteries continue to emerge. Along with the new uses, there is a need for high performance thin-film batteries having improved properties such as higher electrolyte conductivities, more stable electrolytes, and the like. In particular, there is a need for thin film batteries whereby an intrinsic compressive stress of the electrolyte does not result in the formation of hillocks which may cause, for example, fracture of the anode film resulting in battery failure.

SUMMARY

In one embodiment, with regard to the foregoing and other needs, the disclosure provides a solid amorphous electrolyte composition for a thin-film battery. The electrolyte composition includes a lithium phosphorus oxynitride material containing an aluminum ion dopant wherein the atomic ratio of aluminum ion to phosphorus ion (Al/P) in the electrolyte ranges from about 0.1 to about 0.3. The composition is represented by the formula:

$$Li_tP_xAl_yO_uN_vS_w,$$

where 5x+3y=5, 2u+3v+2w=5+t, t ranges from about 2.9 to about 3.3, x ranges from about 0.94 to about 0.85, y ranges from about 0.094 to about 0.26, u ranges from about 3.2 to about 3.8, v ranges from about 0.13 to about 0.46, and w ranges from zero to about 0.2.

In another embodiment the disclosure provides a method for making a solid electrolyte for a thin-film battery. The method includes the steps of providing a lithium orthophosphate ($Li_3PO_4$) composition, an aluminum ion source and, optionally, a sulfide ion source. The lithium orthophosphate composition is combined with an aluminum ion source and, optional, sulfide ion source to yield a sputtering target. The target is sputtered in a gas atmosphere selected from nitrogen gas, argon gas, and mixtures of nitrogen and argon gases to provide an electrolyte film having a composition represented by the formula:

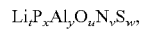

$$Li_tP_xAl_yO_uN_vS_w,$$

where 5x+3y=5, 2u+3v+2w=5+t, t ranges from about 2.9 to about 3.3, x ranges from about 0.94 to about 0.85, y ranges from about 0.094 to about 0.26, u ranges from about 3.2 to about 3.8, v ranges from about 0.13 to about 0.46, and w ranges from zero to about 0.2, and wherein the ratio of aluminum ion to phosphorus ion (Al/P) ranges from greater than 0.1 to about 0.3.

In yet another embodiment, the disclosure provides a method for making an aluminum-doped and sulfide-doped lithium phosphorus oxynitride solid electrolyte for a thin-film battery. The method includes the steps of providing a lithium orthophosphate ($Li_3PO_4$) composition and an aluminum ion source. The target is sputtered in an atmosphere containing nitrogen gas and hydrogen sulfide gas. The mixture of nitrogen gas and hydrogen sulfide gas in the atmosphere is represented by the following:

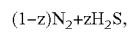

$$(1-z)N_2 + zH_2S,$$

where z is greater than 0 and less than 1. An electrolyte film is formed from the target and mixture having a composition represented by the formula:

$$Li_tP_xAl_yO_uN_vS_w,$$

where 5x+3y=5, 2u+3v+2w=5+t, t ranges from about 2.9 to about 3.3, x ranges from about 0.94 to about 0.85, y ranges from about 0.094 to about 0.26, u ranges from about 3.2 to about 3.8, v ranges from about 0.13 to about 0.46, and w ranges from zero to about 0.2.

An important advantage of the embodiments of the disclosure is that thin-film batteries containing an electrolyte film as described herein may exhibit less tendency fail prematurely. While not desiring to be bound by theoretical considerations, it is believed that doping the electrolyte with aluminum to provide an aluminum-doped and, optionally, a sulfide-doped electrolyte, may reduce or avoid phase separation in the electrolyte film induced by the high intrinsic compressive stresses in the electrolyte film.

It has been observed that phase separation in the electrolyte film may lead to the formation of hillocks on the surface of the electrolyte layer, especially near the edges of shadow masks used to define the shape of the electrolyte film, thereby leading to fracture of an anode current collector film attached to the electrolyte film. Hillocks are hemispherical-shaped regions ranging in size from about 0.1 to about 5 microns. Fracture of the anode current collector film can cause the thin-film battery to fail prematurely.

BRIEF DESCRIPTION OF THE DRAWINGS

Further advantages of the embodiments will become apparent by reference to the detailed description when considered in conjunction with the figures, wherein like reference numbers indicate like elements throughout, and wherein:

FIG. 1 a plan view, not to scale, of a lithium orthophosphate target having an erosion groove and aluminum metal distributed thereon;

FIG. 2 is a cross sectional view, not to scale, of the target of FIG. 1, taken along line 2-2 of FIG. 1;

DETAILED DESCRIPTION OF THE PREFERRED EMBODIMENTS

As set forth above, the disclosure provides an improved thin-film battery electrolyte and method for making the electrolyte. The electrolyte of the disclosure includes a solid lithium phosphorus oxynitride (LIPON) electrolyte film. According to an embodiment of the disclosure, the LIPON-based electrolyte is improved by incorporating therein an aluminum ion and, optionally, a sulfide ion. The amount of aluminum ion in the electrolyte composition is expressed in terms of an aluminum ion to phosphorus ion ratio (Al/P). The Al/P ratio may range from greater than zero to about 0.5. Optimum results may be obtained by providing an Al/P ratio ranging from about 0.1 to about 0.3.

As set forth above, the electrolyte film may optionally be doped with a sulfide ion. When present, the amount of sulfide ion in the electrolyte composition is expressed in terms of a sulfide ion to phosphorus ion ratio (S/P). Accordingly, the S/P ratio preferably ranges from greater than zero up to about 0.2, more preferably from about 0.10 to about 0.15, and most preferably about 0.15.

Electrolyte films incorporating an aluminum ion and, optionally, a sulfide ion are preferably solid amorphous compositions represented by the following formula:

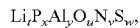

where 5x+3y=5, 2u+3v+2w=5+t, t ranges from about 2.9 to about 3.3, x ranges from about 0.94 to about 0.85, y ranges from about 0.094 to about 0.26, u ranges from about 3.2 to about 3.8, v ranges from about 0.13 to about 0.46, and w ranges from zero to about 0.2. Compositions of the foregoing formula, may contain from about 30 to about 50 atomic percent lithium ion, from about 10 to about 15 atomic percent phosphorus ion, and from about 35 to about 50 atomic percent oxygen ion in addition to the aluminum ion, sulfide ion, and nitrogen ion. Examples of electrolyte film compositions having acceptable Al/P ratios are given in the following table:

| Li ion (atomic %) | P ion (atomic %) | Al ion (atomic %) | O ion (atomic %) | N ion (atomic %) | S ion (atomic %) |
|---|---|---|---|---|---|
| 32.26 | 10.84 | 3.19 | 42.09 | 5.87 | 0.00 |
| 39.11 | 11.55 | 2.62 | 43.31 | 6.04 | 0.00 |
| 38.95 | 11.90 | 1.96 | 43.14 | 6.01 | 0.00 |
| 38.80 | 12.24 | 1.30 | 42.97 | 5.99 | 0.00 |
| 40.12 | 10.85 | 3.19 | 42.11 | 5.87 | 1.05 |
| 40.03 | 11.16 | 2.54 | 41.86 | 5.83 | 1.12 |
| 39.94 | 11.47 | 1.89 | 41.60 | 5.80 | 1.19 |
| 39.82 | 11.79 | 1.25 | 41.40 | 5.77 | 1.22 |
| 40.93 | 10.52 | 3.09 | 40.83 | 5.69 | 20.3 |
| 40.89 | 10.80 | 2.45 | 40.50 | 5.65 | 2.16 |
| 40.86 | 11.08 | 1.83 | 40.18 | 5.60 | 2.29 |
| 40.76 | 11.38 | 1.21 | 39.94 | 5.57 | 2.35 |

Electrolyte films of the foregoing composition may be used in thin-film batteries having oxide-based cathodes, such as $LiCoO_2$ and $LiMn_2O_4$, that operate at potentials above 3.8 volts.

Figure 3:
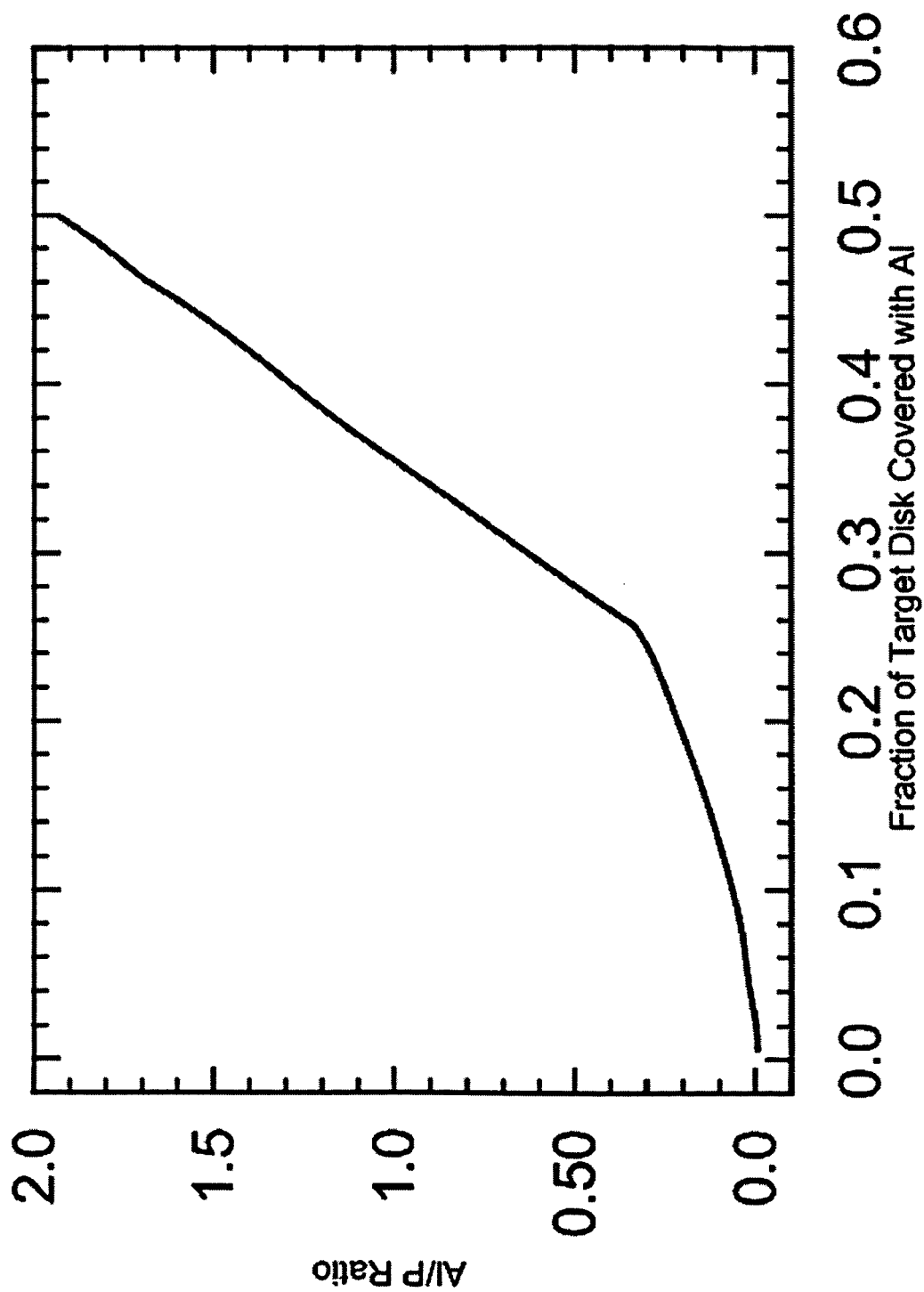
FIG. 3 is a graphical representation of aluminum to phosphorus ratio versus an amount of aluminum metal on a target for radio frequency magnetron sputtering.

The conductivity of electrolyte films made according to the foregoing compositions may be determined by depositing the electrolyte films onto a substrate with suitable electrodes by radio frequency magnetron sputtering of targets 10 (FIGS. 1 and 2) in pure nitrogen gas. The target 10 was a disk 11 of lithium orthophosphate ($Li_3PO_4$) formed by hot pressing $Li_3PO_4$ powder. Aluminum metal coupons 12 were placed on the disk 11 to cover a portion of the disk 11. The portion of the disk 11 covered by the aluminum metal coupons may be determined from a graph of Al/P ratio versus fraction covered illustrated in FIG. 3.

The magnetic field generated during radio frequency (rf) magnetron sputtering of the target 10 in a nitrogen gas atmosphere, concentrates working gas ions, i.e., nitrogen ions, in an annular region located between an edge 14 of the target 10 and a center 16 of the target 10. Hence, an erosion groove 13 ("race track"), as shown in FIGS. 1 and 2, is formed in the disk 11. Most of the material sputtered from the target 10 onto the substrate is known to come from this erosion groove 13.

Qualitative values of the atomic ratios of aluminum (Al), phosphorus (P), oxygen (O) and sulfur (S) in the electrolyte films 22 may be determined from the relative intensities of the Kα and Lβ x-ray fluorescence lines of these elements measured with an energy dispersive x-ray (EDX) analyzer attached to a scanning electron microscope.

The room temperature ionic conductivity of the Al doped electrolyte films according to the disclosure ranges from about 3.2 to about 3.6 µS/cm. Undoped LIPON electrolyte films typically have conductivities ranging from about 2.5 to about 3.0 µS/cm.

A method for making a thin-film battery 40 containing the electrolyte film 42 according to the disclosure will now be described with respect to FIGS. 4-8. The battery 40 preferably includes an insulating support or substrate 44, thin film current collectors 46 and 48, a thin film cathode 50, and a thin film anode 52. Methods for making thin-film batteries are generally well known. Preferred methods are described, for example, in U.S. Pat. No. 5,338,625 to Bates et al., U.S. Pat. No. 5,512,147 to Bates et al., and U.S. Pat. No. 5,597,660 to Bates et al., the disclosures of which are incorporated by reference thereto as if fully set forth herein.

Figure 7:
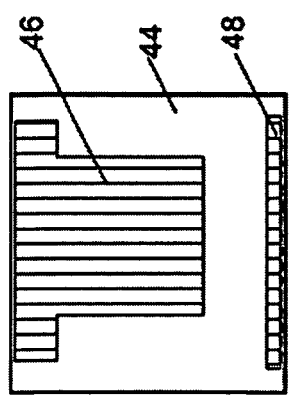

In a first step of the thin-film battery manufacturing process, two current collectors 46 and 48 are deposited on a substrate 44 (FIG. 7). The substrates are preferably selected from ceramic, semiconductor, and polymeric materials such as glass, alumina, sapphire, silicon, plastic and the like. The current collectors 46 and 48 are preferably thin metal films or thin films of electrically conductive oxides. The metals for the metal films are selected from noble and transition metals such as gold, platinum, vanadium, cobalt, nickel, manganese, niobium, tantalum, chromium, molybdenum, titanium, zirconium, tungsten and the like.

The preferred metallic cathode current collector 46 is a 300 angstrom thick transition metal, preferably cobalt (Co) for a LiCoO$_2$ cathode or manganese (Mn) for a LiMn$_2$O$_4$ cathode covered with a 1500 to 2000 angstrom thick gold film. Alternatively, the cathode current collector 46 may be selected from a 300 Angstrom film of titanium (Ti) or tantalum (Ta) covered with a 1500 to 2000 Angstrom thick gold film. If the cathode is not to be heat treated at high temperatures, a single 1500 to 2000 Angstrom thick film of Ti or Ta may be used as the cathode current collector 46. A preferred electrically conductive oxide thin film is indium tin oxide (ITO) having a thickness ranging from about 1500 to about 2000 Angstroms.

The preferred anode current collector 48 may be selected from copper, titanium, or tantalum. For lithium-ion thin film batteries with inorganic or metallic anodes such as tin oxide (SnO$_2$), tin nitride (Sn$_3$N$_4$), zinc nitride (Zn$_3$N$_2$), silicon (Si), and tin (Sn), the most preferred anode current collector 48 is copper. The current collectors 46 and 48 may be deposited by rf or direct current (dc) magnetron sputtering, diode sputtering in argon, vacuum evaporation, or other deposition techniques such as used by the semiconductor electronics industry. The currents collectors 46 and 48 typically have a thickness ranging from about 0.1 to about 0.3 microns.

Figure 8:
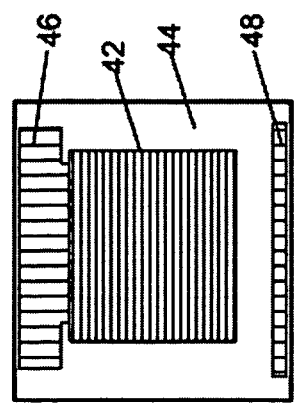

A conductive cathode thin film providing cathode 50 is then deposited over a portion of the current collector 46 (FIG. 8). The cathode thin film is preferably a metal oxide, more preferably a transition metal oxide, and most preferably a metal oxide containing the metal of the current collector 46. Preferred cathodes 50 include, but are not limited to, lithium transition metal oxides such as LiCoO$_2$, LiNiO$_2$, LiMn$_2$O$_4$, LiCo$_{(1-v)}$Ni$_v$O$_2$, and the like, where v ranges from about 0.5 to about 1.0, and transition metal oxides such as crystalline or amorphous vanadium pentoxide (V$_2$O$_5$). The cathode 50 is preferably a 1 to 3 micron thick film that is deposited on the current collector 46 by sputtering alkali metal-transition metal oxide targets in an essentially pure argon atmosphere or in an argon atmosphere containing from about 1 to about 20 volume percent oxygen.

An amorphous lithium aluminum phosphorus oxynitride thin-film electrolyte 42 is then deposited over the cathode 50 and current collector 46 (FIG. 9). The electrolyte 42, according to the invention, is provided as described above by sputtering a lithium orthophosphate disk 11 containing aluminum metal coupons 12 thereon and, optionally, containing a lithium ion and sulfide ion containing powder selected from the group consisting of Li$_2$SO$_4$ and Li$_2$S. The aluminum metal coupons 12 have a thickness ranging from about 0.1 millimeter to about 0.5 millimeter and may cover up to about 50 percent of the lithium orthophosphate disk 11.

In the alternative, the lithium orthophosphate disk 11 may be a hot pressed or cold pressed and sintered disk made from a mixture of Li$_3$PO$_4$ powder and a powder selected from Al$_2$O$_3$, AlN, sulfur, Li$_2$SO$_4$, and Li$_2$S. The electrolyte 42 may also be made by sputtering a lithium orthophosphate disk 11 containing aluminum metal coupons 12 distributed thereon in an atmosphere containing nitrogen gas and hydrogen sulfide gas.

The target 10 is preferably rf magnetron sputtered in a nitrogen gas, argon gas, or mixture of nitrogen gas and argon gas atmosphere at a pressure ranging from about 5 to about 20 milliTorr and a total gas flow ranging from about 20 to about 100 standard cubic centimeters per minute (sccm) for a typical small research vacuum chamber. The electrolyte 42 provided by the sputtering target 10, preferably has a thickness ranging from about 0.5 to about 1.5 microns. The target 10 is sputtered for a period of time ranging from about 0.5 to about 2.5 hours at a sputtering power ranging from about 5 to about 7.5 watts per square centimeter averaged over the total area of the target to provide a film deposition rate averaging from about 100 to about 150 angstroms per minute. The electrolyte made according to the foregoing procedure is a composition of the formula:

$$Li_tP_xAl_yO_uN_vS_w,$$

where 5x+3y=5, 2u+3v+2w=5+t, t ranges from about 2.9 to about 3.3, x ranges from about 0.94 to about 0.85, y ranges from about 0.094 to about 0.26, u ranges from about 3.2 to about 3.8, v ranges from about 0.13 to about 0.46, and w ranges from zero to about 0.2.

Figure 4:
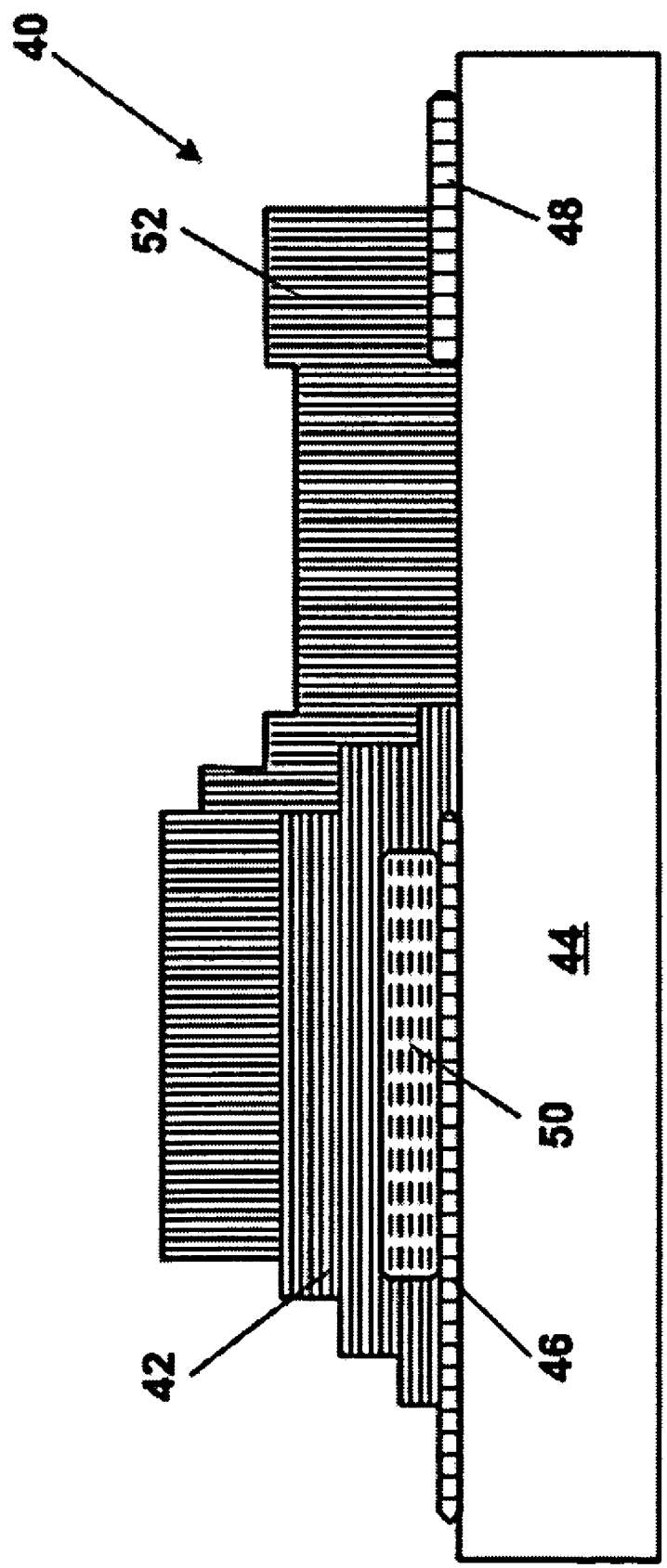
FIG. 4 is a cross-sectional view, not to scale, of a thin-film battery containing an electrolyte according to an embodiment of the disclosure.
Figure 5:
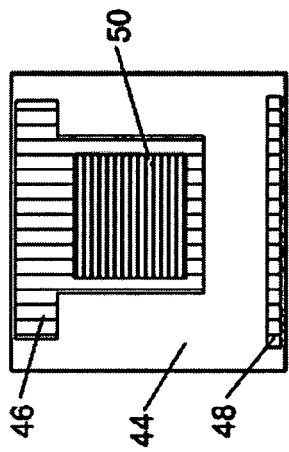
FIGS. 5-8 are plan views, not to scale, of portions of a thin-film battery to illustrate steps during manufacture of thin-film batteries containing electrolytes according to an embodiment of the disclosure.
Figure 6:
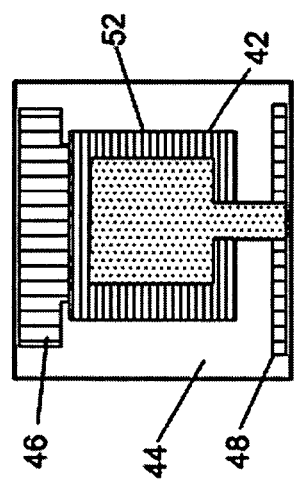

The thin-film battery 40 is completed by depositing a metallic anode 52 over a portion of the electrolyte 42, substrate 44 and current collector 48 as shown in FIGS. 4 and 8. The anode 52 is preferably provided by an alkali metal such as sodium, lithium, potassium, rubidium, cesium and the like. For a lithium containing electrolyte, the preferred alkali metal for the anode is lithium or a lithium containing alloy.

Alternatively, a lithium thin film battery may be fabricated by depositing from about 2000 to about 3000 Angstrom thick copper current collector over the electrolyte 42. In this case, a lithium anode is formed in-situ on a first charge cycle for the thin film battery. The alternative lithium thin film battery is described in U.S. Pat. No. 6,168,884, which is incorporated herein by reference.

The metallic anode 52 may be deposited by evaporation or sputtering techniques and typically has a thickness ranging from about 3 to about 5 microns. For lithium-ion thin film batteries, the anode 52 is preferably provided by silicon, tin, metal nitrides, or metal oxides. Metal nitrides such as Sn$_3$N$_4$ and Zn$_3$N$_2$ may be formed by sputtering tin or zinc in a pure nitrogen gas atmosphere. Inorganic anodes of metal oxides such as SnO$_2$ may be deposited by reactive sputtering of the base metals in an atmosphere of argon and oxygen.

Having described various aspects and embodiments of the disclosure and several advantages thereof, it will be recognized by those of ordinary skills that the embodiments are susceptible to various modifications, substitutions and revisions within the spirit and scope of the appended claims.

What is claimed is:

1. A solid amorphous electrolyte composition for a thin-film battery comprising a lithium phosphorus oxynitride material containing an aluminum ion dopant, wherein the atomic ratio of aluminum ion to phosphorus ion (Al/P) in the electrolyte ranges from greater than zero up to about 0.5, and wherein the composition is represented by the formula:

$$Li_tP_xAl_yO_uN_vS_w,$$

where 5x+3y=5, 2u+3v+2w=5+t, t ranges from about 2.9 to about 3.3, x ranges from about 0.94 to about 0.85, y ranges from about 0.094 to about 0.26, u ranges from about 3.2 to about 3.8, v ranges from about 0.13 to about 0.46, and w ranges from zero to about 0.2.

2. The composition of claim 1 wherein the Al/P ratio ranges from about 0.10 to about 0.3.

3. The composition of claim 1 comprising from about 35 to about 50 atomic percent lithium ion.

4. The composition of claim 1 comprising from about 10 to about 12 atomic percent phosphorus ion.

5. The composition of claim 1 comprising from about 35 to about 50 atomic percent oxygen ion.

6. The composition of claim 1 wherein w is greater than zero.

7. A thin-film battery comprising the solid electrolyte of claim 1.

8. The thin-film battery of claim 7 comprising a cathode selected from the group consisting of $LiCoO_2$, $LiNiO_2$, $LiMn_2O_4$, and $V_2O_5$.

9. The thin-film battery of claim 8 including a cathode current collector comprising indium tin oxide.

10. A method for making a solid electrolyte for a thin-film battery comprising the steps of:
   providing a lithium orthophosphate ($Li_3PO_4$) composition;
   providing an aluminum ion source, and, optionally, a sulfide ion source;
   combining the lithium orthophosphate composition, aluminum ion source, and, optional sulfide ion source to yield a sputtering target;
   sputtering the target in a gas atmosphere selected from nitrogen gas, argon gas, and mixtures of nitrogen and argon gases to provide an electrolyte film having a composition represented by the formula:

$Li_tP_xAl_yO_uN_vS_w$, where $5x+3y=5$, $2u+3v+2w=5+t$, t ranges from about 2.9 to about 3.3, x ranges from about 0.94 to about 0.85, y ranges from about 0.094 to about 0.26, u ranges from about 3.2 to about 3.8, v ranges from about 0.13 to about 0.46, and w ranges from zero to about 0.2, and wherein the ratio of aluminum ion to phosphorus ion (Al/P) ranges from greater than zero up to about 0.5.

11. The method of claim 10 wherein the Al/P ratio ranges from about 0.10 to about 0.3.

12. The method of claim 10 wherein the sputtering is conducted in pure nitrogen gas.

13. The method of claim 10 wherein the sputtering is conducted in pure argon gas.

14. The method of claim 10 wherein the sputtering is conducted in a mixture of nitrogen gas and argon gas.

15. The method of claim 10 wherein the sputtering is conducted over a thin-film battery cathode material selected from the group consisting of $LiCoO_2$, $LiNiO_2$, $LiMn_2O_4$, and $V_2O_5$.

16. The method of claim 10 wherein the aluminum ion source is selected from the group consisting of aluminum metal, aluminum nitride, and aluminum oxide.

17. A thin-film battery containing a solid electrolyte made by the method of claim 10.

18. The thin-film battery of claim 17 including a cathode current collector comprising indium tin oxide.

19. A method for making an aluminum-doped solid lithium phosphorus oxynitride electrolyte for a thin-film battery comprising the steps of:
   providing a lithium orthophosphate ($Li_3PO_4$) composition and an aluminum ion source as a sputtering target;
   sputtering the target in an atmosphere containing nitrogen gas and hydrogen sulfide gas wherein the mixture of nitrogen gas and hydrogen sulfide gas in the atmosphere is represented by the following:

$(1-z)N_2+zH_2S$, where z is greater than 0 and less than 1 to provide an electrolyte film having a composition represented by the formula:

$Li_tP_xAl_yO_uN_vS_w$, where $5x+3y=5$, $2u+3v+2w=5+t$, t ranges from about 2.9 to about 3.3, x ranges from about 0.94 to about 0.85, y ranges from about 0.094 to about 0.26, u ranges from about 3.2 to about 3.8, v ranges from about 0.13 to about 0.46, and w ranges from zero to about 0.2.

20. The method of claim 19 wherein the sputtering is conducted in a mixture of nitrogen gas and argon gas.

21. The method of claim 19 wherein the sputtering is conducted over a thin-film battery cathode material selected from the group consisting of $LiCoO_2$, $LiNiO_2$, $LiMn_2O_4$, and $V_2O_5$.

22. The method of claim 19 wherein the aluminum ion source is selected from the group consisting of aluminum metal, aluminum nitride, and aluminum oxide.

23. A thin-film battery containing a solid electrolyte made by the method of claim 19.

24. The thin-film battery of claim 23 including a cathode current collector comprising indium tin oxide.

* * * * *